(12) United States Patent
Lin

(10) Patent No.: US 7,806,580 B2
(45) Date of Patent: Oct. 5, 2010

(54) LIGHT SOURCE DEVICE

(75) Inventor: Tsung-Yu Lin, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 123 days.

(21) Appl. No.: 12/346,810

(22) Filed: Dec. 30, 2008

(65) Prior Publication Data

US 2009/0323329 A1  Dec. 31, 2009

(30) Foreign Application Priority Data

Jun. 27, 2008  (CN) .................... 2008 1 0302415

(51) Int. Cl.
*F21V 7/04* (2006.01)

(52) U.S. Cl. .................... 362/606; 362/97.1; 362/97.3; 362/235

(58) Field of Classification Search ....... 362/97.1–97.4, 362/617, 618, 612, 613, 331
See application file for complete search history.

(56) References Cited

U.S. PATENT DOCUMENTS

| | | | | |
|---|---|---|---|---|
| 7,085,056 B2 * | 8/2006 | Chen et al. | .................. | 359/566 |
| 7,347,610 B2 * | 3/2008 | Chang et al. | ................. | 362/621 |
| 7,458,714 B2 * | 12/2008 | Chang | ......................... | 362/626 |
| 7,654,723 B2 * | 2/2010 | Chang | ......................... | 362/620 |
| 2007/0165394 A1 * | 7/2007 | Chang | ......................... | 362/97 |

* cited by examiner

*Primary Examiner*—Ali Alavi
(74) *Attorney, Agent, or Firm*—Clifford O. Chi

(57) ABSTRACT

A light source device includes a light conduction, a light source and a light diffusion component. The light conduction component has a first surface and a second surface opposite to the first surface. The second surface has a light input portion. The first surface has a light output portion substantially coaxial with the light input portion and having two opposite longitudinal ends and two opposite lateral ends. The light source is configured to emit lights to the light input portion. The first light diffusion component is positioned on the first surface, and includes row light diffusion components and column light diffusion components substantially perpendicular to the row light diffusion components. The row light diffusion components are positioned at the longitudinal ends of the light output portion. The column light diffusion components are positioned at the lateral ends of the light output portion.

20 Claims, 5 Drawing Sheets

LIGHT SOURCE DEVICE

CROSS-REFERENCE STATEMENT

This application is related to a co-pending U.S. patent application Ser. No. 12/346,807, entitled "LIGHT SOURCE DEVICE", invented by Tsung-Yu Lin. Such application has the same inventor and assignee as the present application.

BACKGROUND

1. Technical Field

The disclosure relates to a light source device.

2. Description of Related Art

Nowadays, planar light sources are widely used in light source devices. When the planar light sources are positioned on glass substrates, part of lights emitted from the planar light sources will be totally refracted at peripheral portions of the substrates, which decreases brightness of the illumination devices.

A typical light source device includes a planar light source, a light conduction component and a plurality of pyramid-shaped prisms. The light conduction component is positioned between the planar light source and the pyramid-shaped prisms. The pyramid-shaped prisms can avoid total refraction occurring at peripheral portions of the light conduction component. However, total refraction may occur at a central portion of the light conduction component, which decreases brightness of the central portion.

Therefore, a new light source device is desired to overcome the above-described shortcoming.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION OF THE EMBODIMENTS

Figure 1:
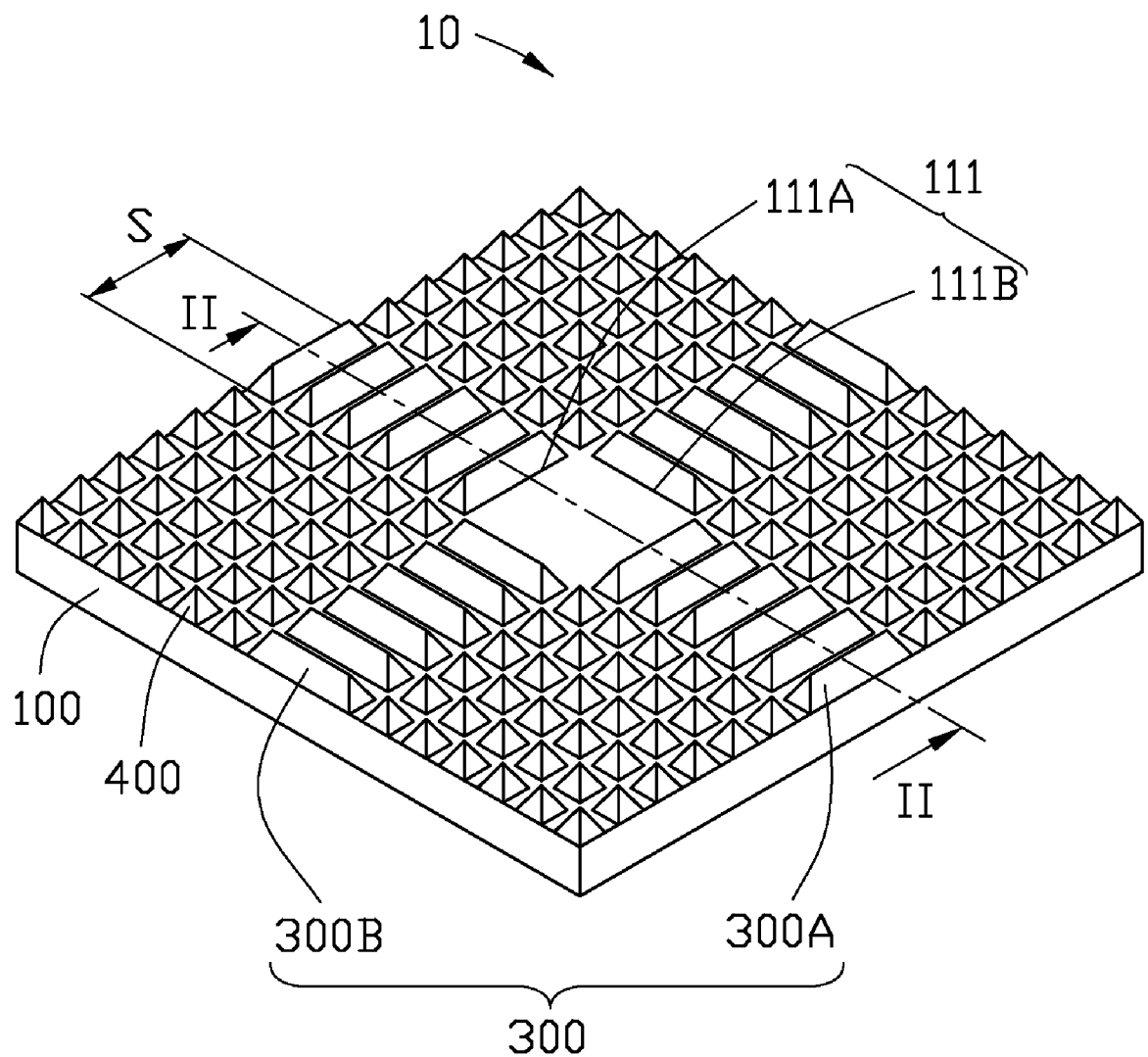
FIG. 1 is a perspective view of one embodiment of a light source device.
Figure 2:
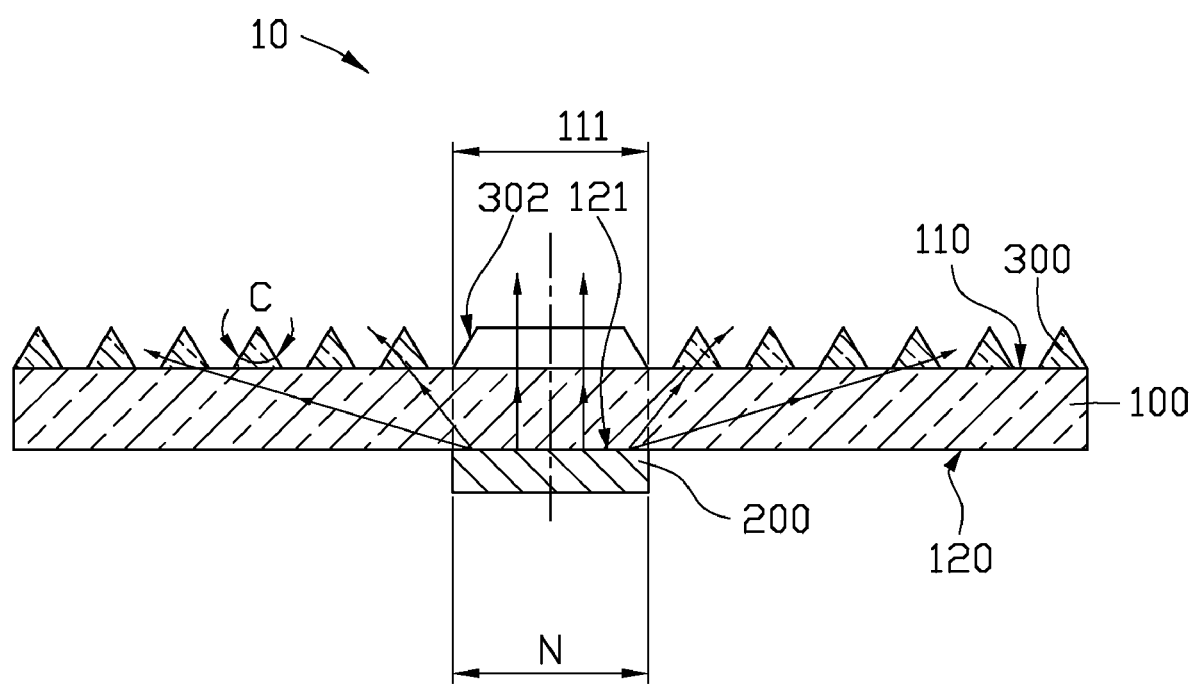
FIG. 2 is a cross-sectional view of the light source device of FIG. 1, taken along line II-II.

Referring to FIGS. 1 and 2, one embodiment of a light source device 10 includes a light conduction component 100, a planar light source 200, a first light diffusion component 300, and a plurality of second light diffusion components 400.

The planar light source 200 may be circular-shaped or may be rectangular shaped. In one embodiment, the planar light source 200 is square-shaped and has a width N of about 177 micrometers. The planar light source 200 includes a plurality of organic light emitting diodes.

The light conduction component 100 distributes lights emitted from the planar light source 200. The light conduction component 100 includes a first surface 110 and a second surface 120 opposite and substantially parallel to the first surface 110. The second surface 120 has a light input portion 121 positioned on a central portion of the light conduction component 100. The cross-section of the light input portion 121 is substantially identical to the cross-section of the planar light source 200. The planar light source 200 is positioned on the light input portion 121. In one embodiment, the light input portion 121 is square-shaped and has a width of about 177 micrometers.

The first surface 110 has a light output portion 111. The light output portion 111 is substantially identical to and substantially coaxial with the light input portion 121. The light output portion 111 has two opposite longitudinal ends 111A and two opposite lateral ends 111B.

The first light diffusion components 300 is positioned on the first surface 110, and include a plurality of row light diffusion components 300A and a plurality of column light diffusion components 300B. The row light diffusion components 300A are positioned at the two opposite longitudinal ends 111A and arranged substantially parallel to each other. Similarly, the column light diffusion components 300B are positioned at the two opposite lateral ends 111B, and arranged substantially parallel to each other and substantially perpendicular to the row light diffusion components 300A. Each of the row and column light diffusion components 300A, 300B may be a strip-shaped prism, and have a substantially triangular or semi-circular shaped cross-section. The base of each of the row and column light diffusion components 300A, 300B may be substantially rectangular shaped. Two slanted faces 302 are formed at opposite ends of each of the row and column diffusion components 300A, 300B. In one embodiment, each of the row and column light diffusion components 300A, 300B has a substantially triangular shaped cross-section and an apex angle C of about 45 degrees. The base of each of the row and column light diffusion components 300A, 300B has a width of about 50 micrometers.

The second light diffusion components 400 are arranged in rows and columns, and positioned on the first surface 110. The second light diffusion components 400 are divided into four spaced rectangular-shaped portions. Each rectangular-shaped portion is positioned between the row light diffusion components 300A and the column diffusion components 300B. In one embodiment, each light diffusion component 400 may be a pyramid-shaped prism. The base of each pyramid-shaped prism 400 is substantially quadrilateral, and has a width of about 50 micrometers and an apex angle of about 45 degrees. In another embodiment, each light diffusion component 400 may be a semi-spherical shaped lens. The base of each semi-spherical shaped lens 400 has a diameter of about 50 micrometers.

Each of the first and second diffusion components 300, 400 has a refractive index substantially equal to the refractive index of the light conduction component 100. In one embodiment, the light conduction component 100 may be made of a transparent material such as a glass material. The first and second light diffusion components 300, 400 may be made of polymethylmethacrylate (PMMA).

In use, the planar light source 200 emits light to the light input portion 121. A portion of the light is transmitted to outside of the light conduction component 100 from the light output portion 111. The remainder of the light is transmitted to the first light diffusion component 300 and the second light diffusion components 400, and refracted to outside of the light source device 10 by the first light diffusion component 300 and the second light diffusion components 400.

Figure 3:
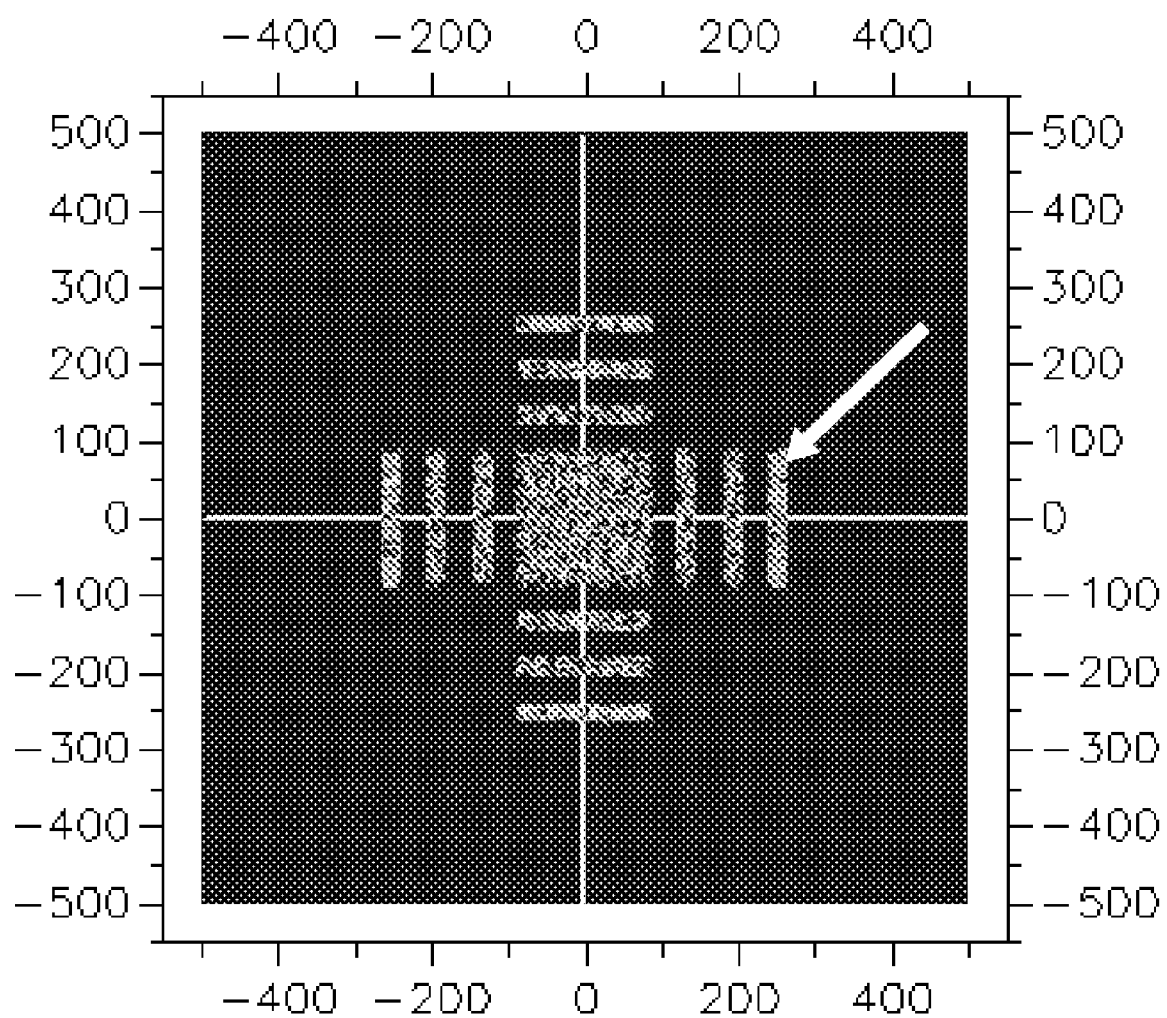
FIG. 3 is a view showing brightness of the light source device of FIG. 1.

Referring to FIG. 3, a large amount of light is emitted from the light output portion 111 and the first light diffusion portion 300. The brightness of the light source device 10 is about 2.483 times greater than the brightness of a light source device that does not have the first and second light diffusion components 300, 400.

Figure 4:
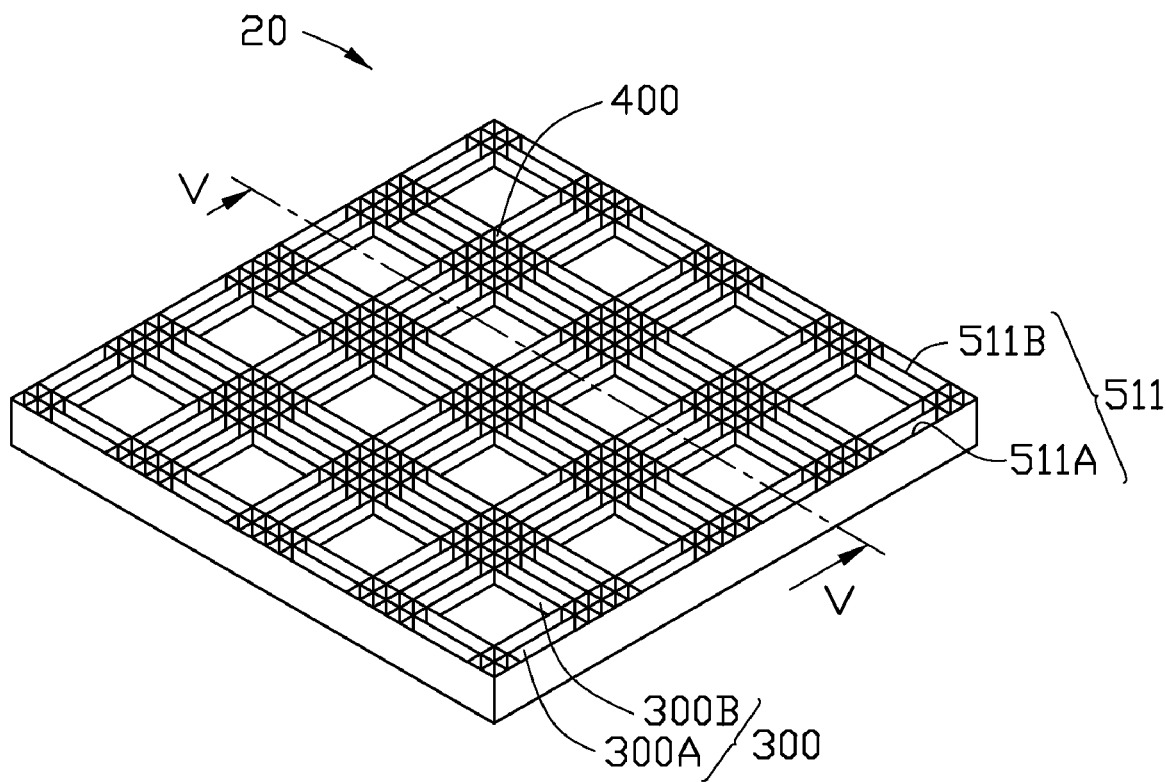
FIG. 4 is a perspective view of another embodiment of a light source device.
Figure 5:
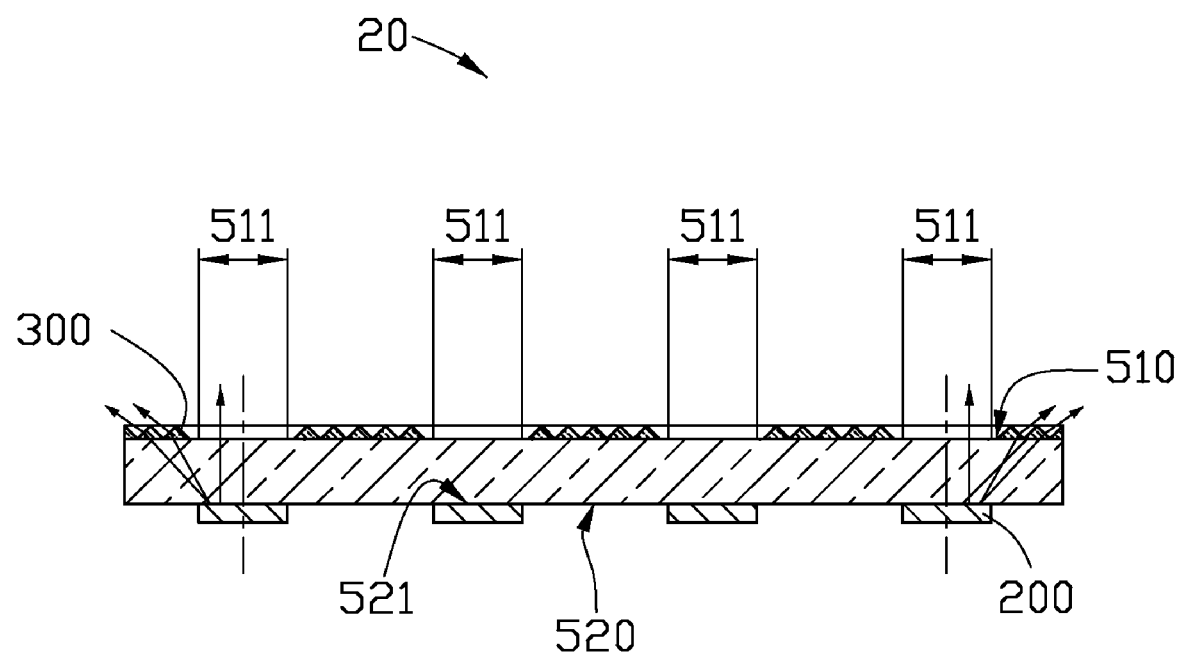
FIG. 5 is a cross-sectional view of the light source device of FIG. 4, taken along line V-V.

Referring to FIGS. 4 and 5, another embodiment of a light source device 20 is similar to the light source device 10 of FIGS. 1 and 2, except that the second surface 520 has a plurality of spaced light input portions 521. The spaced light input portions 521 are arranged in rows and columns. A planar light source 200 is positioned on a corresponding light input portion 521.

The first surface 510 has a plurality of light output portions 511. Each light output portion 511 is coaxial and identical to a corresponding light input portion 521, and has two opposite longitudinal ends 511A and two opposite lateral ends 511B. In one embodiment, the light input portions 521 and the light output portions 511 are square-shaped and have widths of about 177 micrometers.

The first light diffusion components 300 includes a plurality of row light diffusion components 300A and a plurality of column light diffusion components 300B. The row light diffusion components 300A are positioned at the longitudinal ends 511A of each light output portion 511, and arranged substantially parallel to each other. Similarly, the column light diffusion components 300B are positioned at the lateral ends 511B of the light output portion 511, and arranged substantially parallel to each other and substantially perpendicular to the row light diffusion components 300A.

The second light diffusion components 400 are arranged in rows and columns, and positioned on the first surface 510. The second light diffusion components 400 are divided into a plurality of spaced rectangular-shaped portions. Each rectangular-shaped portion is positioned between the row light diffusion components 300A and the column diffusion components 300B. In one embodiment, each of the row and column light diffusion components 300A, 300B may be a strip-shaped prism and have a substantially triangular cross-section. The second light diffusion components 400 are pyramid-shaped. The row and column light diffusion components 300A, 300B intersect to form the second pyramid-shaped light diffusion components 400.

It is believed that the present embodiments and their advantages will be understood from the foregoing description, and it will be apparent that various changes may be made thereto without departing from the spirit and scope of the embodiments or sacrificing all of its material advantages.

What is claimed is:

1. A light source device, comprising:
a light conduction component having a first surface and a second surface opposite to the first surface, the second surface having a light input portion, the first surface having a light output portion, the light output portion being substantially coaxial with the light input portion and having two opposite longitudinal ends and two opposite lateral ends;
a light source configured to emit light to the light input portion; and
a first light diffusion component positioned on the first surface and comprising a plurality of row light diffusion components and a plurality of column light diffusion components substantially perpendicular to the row light diffusion components, wherein the row light diffusion components are positioned at the longitudinal ends of the light output portion; the column light diffusion components are positioned at the lateral ends of the light output portion.

2. The light source device of claim 1, wherein the light input portion is square-shaped and has a width of about 177 micrometers.

3. The light source device of claim 2, wherein the light output portion is substantially identical to the light input portion.

4. The light source device of claim 1, wherein the light source is positioned on the light input portion.

5. The light source device of claim 1, wherein the light source is a planar light source.

6. The light source device of claim 5, wherein the light source is square-shaped and has a width of about 177 micrometers.

7. The light source device of claim 1, wherein each of the row and column light diffusion components is a strip-shaped prism and has a substantially triangular or semi-circular shaped cross-section; the base of each first light diffusion components is substantially rectangular shaped.

8. The light source device of claim 7, wherein two slanted faces are formed at opposite ends of each of the row and column diffusion components.

9. The light source device of claim 7, wherein each of the row and column light diffusion components has a substantially triangular shaped cross-section and an apex angle of about 45 degrees; the base of each of the row and column light diffusion components has a width of about 50 micrometers.

10. The light source device of claim 1, further comprising a plurality of second light diffusion components arranged in rows and columns, and positioned on the first surface, wherein the second light diffusion components are divided into four spaced rectangular-shaped portions; each rectangular-shaped portion is positioned between the row light diffusion components and the column diffusion components.

11. A light source device, comprising:
a light conduction component having a first surface and a second surface opposite to the first surface, the second surface having a plurality of light input portions arranged in rows and columns, the first surface having a plurality of light output portions, each light output portion being substantially coaxial with a corresponding light input portion and having two opposite longitudinal ends and two opposite lateral ends;
a plurality of light sources configured to emit light to the light input portions; and
a first light diffusion component positioned on the first surface and comprising a plurality of row light diffusion components and a plurality of column light diffusion components substantially perpendicular to the row light diffusion components, wherein the row light diffusion components are positioned at the longitudinal ends of each light output portion; the column light diffusion components are positioned at the lateral ends of the light output portion.

12. The light source device of claim 11, wherein each light output portion is substantially identical to a corresponding light input portion.

13. The light source device of claim 11, wherein each light input portion is square-shaped and has a width of about 177 micrometers.

14. The light source device of claim 11, wherein each light source is positioned on a corresponding light input portion.

15. The light source device of claim 11, wherein each light source is a planar light source.

16. The light source device of claim 15, wherein each light source is square-shaped and has a width of about 177 micrometers.

17. The light source device of claim 11, wherein each of the row and column light diffusion components is a strip-shaped prism, and has a substantially triangular or semi-circular shaped cross-section; the base of each of the row and column light diffusion components is substantially rectangular shaped.

18. The light source device of claim 17, wherein each of the row and column light diffusion components has a substantially triangular shaped cross-section and an apex angle of about 45 degrees; the base of each of the row and column light diffusion components has a width of about 50 micrometers.

19. The light source device of claim 11, further comprising a plurality of second light diffusion components arranged in rows and columns, and positioned on the first surface, wherein the second light diffusion components are divided into a plurality of spaced rectangular-shaped portions; each rectangular-shaped portion is positioned between the row light diffusion components and the column diffusion components.

20. The light source device of claim 19, wherein each second light diffusion component is a pyramid-shaped prism or a semi-sphere shaped lens.

* * * * *